United States Patent [19]

Korver

[11] 4,024,433

[45] May 17, 1977

[54] CIRCUIT FOR GENERATING A DEFLECTION CURRENT THROUGH A COIL FOR THE VERTICAL DEFLECTION IN A DISPLAY TUBE

[75] Inventor: Jan Abraham Cornelis Korver, Eindhoven, Netherlands

[73] Assignee: U.S. Philips Corporation, New York, N.Y.

[22] Filed: Sept. 17, 1975

[21] Appl. No.: 614,255

[30] Foreign Application Priority Data

Sept. 20, 1974 Netherlands .................... 7412438

[52] U.S. Cl. .................... 315/397; 315/387
[51] Int. Cl.² .................... H01J 29/70; H01J 29/76
[58] Field of Search .................... 315/396, 397, 387

[56] References Cited

UNITED STATES PATENTS

| | | | |
|---|---|---|---|
| 3,034,013 | 5/1962 | Bourget | 315/397 |
| 3,070,727 | 12/1962 | Birt | 315/396 |
| 3,109,122 | 10/1963 | Cornell et al. | 315/397 |
| 3,144,580 | 8/1964 | Bridges et al. | 315/397 |
| 3,303,380 | 2/1967 | Kozikowski | 315/397 |
| 3,887,842 | 6/1975 | Owens et al. | 315/397 |

Primary Examiner—Maynard R. Wilbur
Assistant Examiner—T. M. Blum
Attorney, Agent, or Firm—Frank R. Trifari; Henry I. Steckler

[57] ABSTRACT

A field deflection output circuit in which the end of the deflection coil which is not connected to the output amplifier is coupled with a terminal of a voltage source during the scan period and with the other terminal of this voltage source during the flyback period.

8 Claims, 1 Drawing Figure

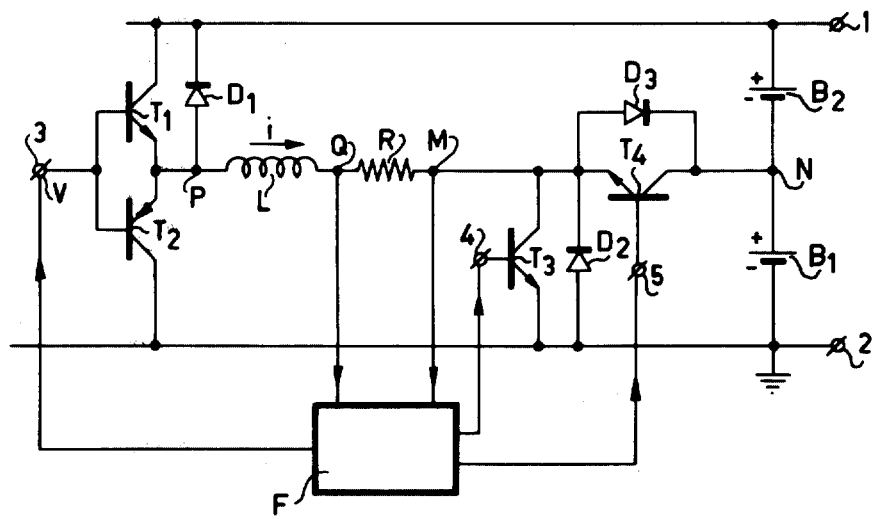

CIRCUIT FOR GENERATING A DEFLECTION CURRENT THROUGH A COIL FOR THE VERTICAL DEFLECTION IN A DISPLAY TUBE

The invention relates to a circuit for generating a saw-tooth deflection current having a scan and a flyback through a coil for the vertical deflection in a display tube, including means for applying control signals to an output amplifier to an output terminal of which the deflection coil can be connected.

To ensure that the direction of the deflection current can be rapidly reversed during the flyback period a higher voltage is in known circuits applied to the deflection coil during this period than during the scan period. To this end a pulse generator is used in the U.S. Pat. No. 3,070,727 which during the flyback period generates pulses which are added to the scan voltage. In an embodiment (see FIG. 16) these pulses are applied by means of a transformer. A winding thereof is connected in series with the end which points away from the output amplifier. An advantage of this embodiment is that the pulses are not present in the output amplifier and consequently cannot cause energy loss therein.

It is an object of the invention to provide a circuit which does not include a transformer, as this transformer occupies much room and is an expensive element and which circuit can furthermore be integrated in a semiconductor body. To this end the circuit according to the invention is characterized in that the circuit furthermore includes switching elements for coupling during the scan period the end of the deflection coil which points away from the output terminal of the output amplifier with a first terminal of a voltage source and for coupling the said end of the deflection coil with the second terminal of the voltage source during the flyback period. Owing to the measure according to the invention the dissipation in the circuit is low, whilst the supply voltage is also low and is not increased during the flyback period so that the circuit is integrable.

The invention will be further explained with reference to the accompanying drawing, in which the circuit diagram of an embodiment of the circuit according to the invention is shown.

In the Figure in the field deflection circuit of a television receiver, not further shown here, one end P of a field deflection coil L is connected to the interconnected emitters of two transistors $T_1$ and $T_2$. The collector of transistor $T_1$, which is of the npn type is connected to a terminal 1 and the collector of transistor $T_2$, which is of the pnp type is connected to a terminal 2. Two d.c. voltage sources $B_1$ and $B_2$ are connected in series between terminals 2 and 1, which sources have the polarity as shown in the Figure whilst terminal 2 may be connected to earth. The bases of transistors $T_1$ and $T_2$ are interconnected and form an input terminal 3 to which during the scan period a substantially linear control voltage V is applied.

Between end P and terminal 1 a diode $D_1$ is included whose direction of conduction is opposite to that of the collector current of transistor $T_1$. The other end Q of coil L is connected to a measuring resistor R which has a small value. Only one coil is shown in the Figure, it will, however, be clear that this coil may consist of the series — or the parallel connection of two or more separate coils. The connection M of resistor R which is not connected to end Q is connected to the collector of an npn transistor $T_3$ and to the emitter of an npn transistor $T_4$. The emitter of transistor $T_3$ is connected to terminal 2 and the collector of transistor $T_4$ is connected to the junction N of sources $B_1$ and $B_2$. Between point M and terminal 2 or point M and N, respectively, a diode $D_2$ or $D_3$ is included, whose direction of conduction is opposite to that of the collector current of transistor $T_3$ or $T_4$, respectively.

Transistors $T_1$ and $T_2$ are so adjusted that they are non-conducting in the absence of a control voltage. So they form a class B output amplifier. During the first half of the scan period the control voltage $v$ at terminal 3 is positive with respect to the bias voltage at the bases of transistors $T_1$ and $T_2$ whilst to the base of transistor $T_3$, which base forms a terminal 4 such a voltage is applied during the entire scan period that the base voltage is negative with respect to the emitter voltage or equal to it. In a similar manner such a voltage is applied during the entire scan period to the base of transistor $T_4$, which base forms a terminal 5, that the base voltage is positive with respect to the emitter voltage. In these circumstances transistor $T_1$ conducts during the first half of the scan period whilst transistors $T_2$ and $T_3$ are non-conducting. Consequently the deflection current $i$ flows through coil L in the direction indicated in the Figure, so that diode $D_3$ also conducts. Because the voltage at point M is consequently slightly higher than that at point N transistor $T_4$ is cut-off. For simplicity's sake the adjusting means of the transistors and the means for a good take-over of the currents through them are not shown in the Figure.

Because coil L behaves during the scan period substantially as an ohmic resistance, also current $i$ is a substantially linear function of the time, whereby the so-called S-correction as well as other corrections have been left out of consideration. Approximately in the middle of the scan period the voltage $v$ becomes zero with respect to the bias voltage of transistors $T_1$ and $T_2$ whereafter they become negative with respect thereto. Consequently, current $i$ also becomes zero at approximately the same moment and thereafter reverses its direction. Now transistors $T_4$ and $T_2$ are conducting whilst diode $D_3$ is cut-off. Because transistor $T_4$ is driven to saturation, the voltage at point M is therefore substantially equal to that at point N during the entire scan period, i.e. the voltage $V_{b_1}$ of source $B_1$. Consequently, the voltage across coil L is approximately equal to $V_{B_1}$ less voltage $v$. The bias voltage of transistors $T_1$ and $T_2$ must be approximately equal to voltage $V_{B_1}$.

Connected to the connections M and Q of resistor R is a negative feedback circuit F which in known manner ensures during the scan period that current $i$ remains of the same shape as voltage $v$. However, during the flyback period the voltage $v$ varies very quickly since the flyback period occupies approximately one twentieth part of the whole period. As coil L has for quick variations a predominantly reactive impedance, current $i$ cannot immediately follow this variation. Owing to the voltage measured across resistor R circuit F now ensures that transistors $T_2$ and $T_4$ are cutoff because their base voltage becomes higher respectively lower than (or equal to) the emitter voltage. During the second half of the scan period current $i$ flows in the direction which is opposite to the direction indicated in the Figure. At the beginning of the flyback period the current must continue to flow in the same direction as before, consequently it flows through diodes $D_2$ and $D_1$. Thus the potential at point P becomes substantially equal to that of terminal 1 whilst the potential at point M becomes approximately zero. Now the voltage across coil L is approximately equal to the sum $V_{B_1} + V_{B_2}$ of the voltages of sources $B_1$ and $B_2$, which sum has been chosen so that the flyback period, i.e. the period whereafter current $i$ again resumes the same maximum magnitude in absolute value, is of the desired duration.

Because transistor $T_2$ is cut-off, transistor $T_1$ could conduct but for the fact that the conductor current through it would flow in the wrong direction. The same applies to transistor $T_3$ to whose base a voltage derived at the beginning of the flyback period from circuit F would be supplied, which is more positive than the emitter voltage. However, approximately in the middle of the flyback period current $i$ becomes zero whereafter its direction is reversed and consequently flows through transistors $T_1$ and $T_3$. Finally, at the beginning of the scan period the variation in voltage $v$ is slow again. A cut-off voltage is applied to the base of transistor $T_3$ by circuit F. Because current $i$ flows into the direction indicated in the Figure, diode $D_3$ starts conducting whilst transistor $T_1$ is brought out of saturation. This is the original situation.

It will be clear from the above that transistor $T_1$ which, during the scan period is part of a class B amplifier $T_1$, $T_2$, i.e. a linear amplifier, is part of a bipolar switch $T_1$, $D_1$ during the fly-back period. It will be clear that the switch can be constructed separately and also that the class B setting is not of real importance for the measure according to the invention.

In the construction described the controlling signals are generated by negative feedback circuit F, so backwards. It is clear that these signals can also be supplied by a forward-acting circuit. An example of a similar negative feedback circuit has already been described in U.S. Pat. Nos. 3,934,173 and 3,781,589.

Sources $B_1$ and $B_2$ may be constructed in known manner, for example by means of two high-capacity capacitors, whilst a supply circuit supplies a direct voltage between terminals 1 and 2.

It will be noted that the dissipation in the circuit is rather low except that, caused by the deflection coil. This is as a result of the fact that all transistors and diodes operate exclusively as switches, with the exception of transistors $T_1$ and $T_2$ during the scan period. Because the supply voltage is also low and is not increased during the flyback period, the circuit, except the capacitors and the deflection coil may be advantageously integrated in a semiconductor body.

What is claimed is:

1. A circuit for generating a saw-tooth deflection current having a scan and a flyback period from a first voltage source having two terminals through a coil for the vertical deflection of a cathode ray in a display tube, said circuit comprising an output amplifier that has zero power dissipation during the retrace period and including input and output terminals, means for applying control signals to said output amplifier input terminal the deflection coil having a first end being adapted to be connected to said output terminal, and switching elements means for coupling during the scan period the second end of the deflection coil to said first terminal of said voltage source and for coupling during the flyback period said second end of the deflection coil to the second terminal of the voltage source.

2. A circuit as claimed in claim 1, wherein the switching elements comprise first, second, and third switches which may conduct into two directions.

3. A circuit as claimed in claim 2, wherein each switch comprises a transistor and a diode, the direction of conduction of the diode being opposite to that of the collector current of the respective transistor, and further comprising control means for driving the transistor onto the saturation state.

4. A circuit as claimed in claim 3, wherein said first switch is coupled between the first end of the deflection coil and a first terminal of a second voltage source, said second switch is coupled between the second end of the deflection coil and the second terminal of the second voltage source, which second terminal is coupled to a first terminal of the first voltage source, and said third switch is coupled between said second end of the deflection coil and the second terminal of the first voltage source, the first and the third switch being conducting in the flyback period and the second switch being conducting during the scan period.

5. A circuit as claimed in claim 4, wherein the output amplifier comprises two transistors which are connected in series and in which the junction thereby formed comprises said output terminal of the amplifier, one of said amplifier transistors also comprising the transistor in the first switch.

6. A circuit as claimed in claim 4, wherein the sum of the voltages of the d.c. voltage sources is the supply voltage of the output amplifier.

7. A semiconductor body for use in a circuit as claimed in claim 5, wherein at least the transistors, the switches, and the control means are integrated in the semiconductor body.

8. A television receiver comprising a deflection circuit as claimed in claim 1.

* * * * *